United States Patent
Singhal et al.

(10) Patent No.: US 11,717,866 B2
(45) Date of Patent: Aug. 8, 2023

(54) ETCHING METAL-OXIDE AND PROTECTING CHAMBER COMPONENTS

(71) Applicant: Lam Research Corporation, Fremont, CA (US)

(72) Inventors: Akhil N. Singhal, Portland, OR (US); Dustin Zachary Austin, Corvallis, OR (US); Alon Ganany, Tigard, OR (US); Daniel Boatright, Estacada, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 17/738,825

(22) Filed: May 6, 2022

(65) Prior Publication Data

US 2022/0258216 A1 Aug. 18, 2022

Related U.S. Application Data

(63) Continuation of application No. 17/278,191, filed as application No. PCT/US2019/052208 on Sep. 20, 2019, now abandoned.
(Continued)

(51) Int. Cl.
*B08B 9/08* (2006.01)
*B08B 3/08* (2006.01)
(Continued)

(52) U.S. Cl.
CPC ............... *B08B 9/08* (2013.01); *B08B 3/08* (2013.01); *B08B 5/00* (2013.01); *C23C 16/4405* (2013.01); *B08B 2209/08* (2013.01)

(58) Field of Classification Search
None
See application file for complete search history.

(56) References Cited

U.S. PATENT DOCUMENTS 6,528,427 B2 * 3/2003 Chebi ............... B08B 7/0071
  438/913
10,840,082 B2 * 11/2020 Singhal ........... H01L 21/67069
(Continued)

FOREIGN PATENT DOCUMENTS

CN 101174081 5/2008
CN 112740378 4/2021
(Continued)

OTHER PUBLICATIONS

Plasma Etching of ITO Thin Films Using CH4/H2 Gas Mixture Mohri et al 1990 Jpn. J. Appl. Phys. 29 L1932-1935 (Year: 1990).*
(Continued)

*Primary Examiner* — Eric W Golightly
*Assistant Examiner* — Arlyn I Rivera-Cordero
(74) *Attorney, Agent, or Firm* — Schwegman Lundberg & Woessner, P.A.

(57) ABSTRACT

Various embodiments include methods and chemistries to etch metal-oxide films. In one embodiment, a method of etching tin oxide ($SnO_2$) films includes using thionyl chloride ($SOCl_2$) chemistry to produce an etch rate of the $SnO_2$ films of up to 10-times higher as compared with $Cl_2$ chemistry for similar flow-rates and process conditions, and gettering oxygen species from the $SnO_2$ films by using the $SOCl_2$, thereby forming volatile $SO_2$ and volatile $SnCl_4$ to provide human safety and machine safety and operations. Other methods, chemistries, and techniques are disclosed.

8 Claims, 19 Drawing Sheets

Related U.S. Application Data

(60) Provisional application No. 62/734,648, filed on Sep. 21, 2018.

(51) Int. Cl.
*B08B 5/00* (2006.01)
*C23C 16/44* (2006.01)

(56) References Cited

U.S. PATENT DOCUMENTS

| | | |
|---|---|---|
| 2011/0088718 A1 | 4/2011 | Torres, Jr. et al. |
| 2015/0218695 A1 | 8/2015 | Odedra |
| 2016/0379833 A1 | 12/2016 | Hong et al. |
| 2017/0146909 A1 | 5/2017 | Smith et al. |
| 2017/0213709 A1 | 7/2017 | Wu et al. |
| 2018/0012759 A1* | 1/2018 | Smith .............. H01L 21/0332 |
| 2018/0240667 A1 | 8/2018 | Yu et al. |

FOREIGN PATENT DOCUMENTS

| | | |
|---|---|---|
| CN | 115360093 A | 11/2022 |
| JP | H02158129 A | 6/1990 |
| JP | 2016516287 A | 6/2016 |
| JP | 2021528857 A | 10/2021 |
| JP | 2021534571 A | 12/2021 |
| JP | 2022501824 | 1/2022 |
| KR | 20150095611 A | 8/2015 |
| TW | 201410914 | 3/2014 |
| WO | 9800874 | 1/1998 |
| WO | 2020061484 | 3/2020 |
| WO | WO-2020050124 A1 | 3/2020 |

OTHER PUBLICATIONS

"International Application Serial No. PCT US2019 052208, International Search Report dated Jan. 10, 2019", 3 pgs.

"International Application Serial No. PCT US2019 052208, Written Opinion dated Jan. 10, 2019", 5 pgs.

"U.S. Appl. No. 17/278,191, Preliminary Amendment filed Mar. 19, 2021", 6 pgs.

"International Application Serial No. PCT US2019 052208, International Preliminary Report on Patentability dated Apr. 1, 2021", 7 pgs.

"U.S. Appl. No. 17/278,191, Non Final Office Action dated Sep. 29, 2021", 12 pgs.

"Chinese Application Serial No. 201980061918.8, Office Action dated Nov. 18, 2021", w machine English Translation, pgs, 18 pages.

"U.S. Appl. No. 17/278,191, Response filed Dec. 13, 2021 to Non Final Office Action dated Sep. 29, 2021", 11 pgs.

"U.S. Appl. No. 17/278,191, Notice of Allowance dated Feb. 9, 2022", 8 pgs.

Korean Application Serial No. 10-2021-7011709, Notice of Preliminary Rejection dated Oct. 8, 2022, w/ English translation, 12 pgs.

* cited by examiner

200

| RUN | PATTERN | CL$_2$ FLOW | Ar FLOW | He FLOW | PRESSURE | CCP POWER | ETCH RATE |
|---|---|---|---|---|---|---|---|
| | | sccm | sccm | sccm | mTorr | W | Å/min |
| 1 | 111 | 100 | 500 | 500 | 500 | 50 | 7 |
| 2 | 113 | 100 | 500 | 500 | 500 | 200 | 19 |
| 3 | 122 | 100 | 500 | 500 | 1250 | 125 | 26 |
| 4 | 131 | 100 | 500 | 500 | 2000 | 50 | 6 |
| 5 | 133 | 100 | 500 | 500 | 2000 | 200 | 60 |
| 6 | 212 | 200 | 500 | 500 | 500 | 125 | 35 |
| 7 | 221 | 200 | 500 | 500 | 1250 | 50 | 11 |
| 8 | 222 | 200 | 500 | 500 | 1250 | 125 | 43 |
| 9 | 222 | 200 | 500 | 500 | 1250 | 125 | 41 |
| 10 | 223 | 200 | 500 | 500 | 1250 | 200 | 100 |
| 11 | 232 | 200 | 500 | 500 | 2000 | 125 | 79 |
| 12 | 311 | 300 | 500 | 500 | 500 | 50 | 13 |
| 13 | 313 | 300 | 500 | 500 | 500 | 200 | 76 |
| 14 | 322 | 300 | 500 | 500 | 1250 | 125 | 62 |
| 15 | 331 | 300 | 500 | 500 | 2000 | 50 | 13 |
| 16 | 333 | 300 | 500 | 500 | 2000 | 200 | 184 |

| RUN | PATTERN | CL₂ FLOW | Ar FLOW | He FLOW | H₂ FLOW | PRESSURE | CCP POWER | ETCH RATE |
|---|---|---|---|---|---|---|---|---|
| | | sccm | sccm | sccm | sccm | mTorr | W | Å/min |
| 1 | 111 | 20 | 500 | 500 | 50 | 500 | 200 | 40 |
| 2 | 113 | 20 | 500 | 500 | 600 | 500 | 200 | 126 |
| 3 | 122 | 20 | 500 | 500 | 325 | 1250 | 200 | 130 |
| 4 | 131 | 20 | 500 | 500 | 50 | 2000 | 200 | 114 |
| 5 | 133 | 20 | 500 | 500 | 600 | 2000 | 200 | 399 |
| 6 | 212 | 160 | 500 | 500 | 325 | 500 | 200 | 138 |
| 7 | 221 | 160 | 500 | 500 | 50 | 1250 | 200 | 244 |
| 8 | 222 | 160 | 500 | 500 | 325 | 1250 | 200 | 465 |
| 9 | 222 | 160 | 500 | 500 | 325 | 1250 | 200 | 463 |
| 10 | 223 | 160 | 500 | 500 | 600 | 1250 | 200 | 455 |
| 11 | 232 | 160 | 500 | 500 | 325 | 2000 | 200 | 447 |
| 12 | 311 | 300 | 500 | 500 | 50 | 500 | 200 | 93 |
| 13 | 313 | 300 | 500 | 500 | 600 | 500 | 200 | 167 |
| 14 | 322 | 300 | 500 | 500 | 325 | 1250 | 200 | 503 |
| 15 | 331 | 300 | 500 | 500 | 50 | 2000 | 200 | 495 |
| 16 | 333 | 300 | 500 | 500 | 600 | 2000 | 200 | 735 |

| RUN | PATTERN | Ar CARRIER FLOW | Ar FLOW | He FLOW | PRESSURE | CCP POWER | ETCH RATE |
|---|---|---|---|---|---|---|---|
| | | sccm | sccm | sccm | mTorr | W | Å/min |
| 1 | 111 | 20 | 500 | 500 | 500 | 50 | 606 |
| 2 | 113 | 20 | 500 | 500 | 500 | 200 | 2231 |
| 3 | 122 | 20 | 500 | 500 | 750 | 125 | 3115 |
| 4 | 131 | 20 | 500 | 500 | 1000 | 50 | 1273 |
| 5 | 133 | 20 | 500 | 500 | 1000 | 200 | 2785 |
| 6 | 212 | 60 | 500 | 500 | 500 | 125 | 2191 |
| 7 | 221 | 60 | 500 | 500 | 750 | 50 | 2047 |
| 8 | 222 | 60 | 500 | 500 | 750 | 125 | 3209 |
| 9 | 222 | 60 | 500 | 500 | 750 | 125 | 3264 |
| 10 | 223 | 60 | 500 | 500 | 750 | 200 | 1989 |
| 11 | 232 | 60 | 500 | 500 | 1000 | 125 | 2777 |
| 12 | 311 | 100 | 500 | 500 | 500 | 50 | 455 |
| 13 | 313 | 100 | 500 | 500 | 500 | 200 | 869 |
| 14 | 322 | 100 | 500 | 500 | 750 | 125 | 1422 |
| 15 | 331 | 100 | 500 | 500 | 1000 | 50 | 1493 |
| 16 | 333 | 100 | 500 | 500 | 1000 | 200 | 1109 |

FIG. 2E

POSSIBLE REACTIONS $$2\ SOCl_2 + SnO_2 \rightarrow SnCl_4 + 2\ SO_2$$

$$2\ SOCl_2 + SiO_2 \rightarrow SiCl_4 + 2\ SO_2$$

FIG. 3

POSSIBLE REACTIONS

$$2\ SOCl_2 + SnO_2 \rightarrow SnCl_4 + 2\ SO_2$$

$$2\ SOCl_2 + SiO_2 \rightarrow SiCl_4 + 2\ SO_2$$

FIG. 8B

ETCHING METAL-OXIDE AND PROTECTING CHAMBER COMPONENTS

CLAIM OF PRIORITY

This patent application is a continuation of and claims the benefit of priority under 35 U.S.C. § 120 to U.S. patent application Ser. No. 17/278,191, filed on Mar. 19, 2021, which is a U.S. National-Phase Filing under 35 U.S.C. § 371 from International Application No. PCT/US2019/052208, filed on 20 Sep. 2019, entitled "ETCHING METAL-OXIDE AND PROTECTING CHAMBER COMPONENTS," and published as WO 2020/061484 A1 on 26 Mar. 2020, which claims priority to U.S. Provisional Application Ser. No. 62/734,648, entitled, "ETCHING METAL-OXIDE FILMS AND PROTECTING CHAMBER COMPONENTS FROM HALOGEN (CHLORINE) CHEMISTRIES," filed 21 Sep. 2018; the disclosure of each of which is incorporated herein by reference in its entirety.

TECHNICAL FIELD

The subject matter disclosed herein relates to etching of various films used in the semiconductor and allied industries. More specifically, the disclosed subject matter relates to removing tin oxide films from plasma process chambers and other surfaces.

BACKGROUND

As is known to a person of ordinary skill in the art, tin oxide ($SnO_2$) films are used for a variety of applications including, for example, extreme ultraviolet (EUV) hard masks, patterning spacers and mandrels for double and quad patterning, gap-fill metal oxides, hard masks, and etch stop layers. Consequently, tin oxide films are deposited on various substrate types in a process chamber via, for example, capacitively-coupled plasma (CCP) techniques. For tin oxide to be able to serve in high-volume manufacturing (HVM), the process chamber should periodically be cleaned of the as-deposited tin oxide film, leaving little to no tin oxide residue on walls and other surfaces within the process chamber. As is known to a person of ordinary skill in the art, tin oxide residues can cause contamination and defects on fabricated devices. For example, if the tin oxide film is not etched or otherwise cleaned or removed from the process chamber, the unremoved tin oxide can result in defects on a substrate as a result of the tin oxide film peeling off chamber components (e.g., due to poor adhesion as a result of buildup of in-film stress).

Typically, metal oxide films, such as tin oxide, may be etched with various chemistries known in the art such as, for example, hydrogen ($H_2$), methane ($CH_4$), chlorine ($Cl_2$), hydrochloric acid (HCl), bromide (Br), hydrobromic acid (HBr), boron trichloride ($BCl_3$), hydrogen iodide (HI), and iodine ($I_2$). Many contemporaneous process chambers comprise aluminum (Al) or aluminum-alloy components. Most of the above-listed chemistries (with the exception of hydrogen and methane) cannot be used in process chambers (e.g., CCP chambers) having aluminum components as each of the listed chemistries attacks Al, thus forming one or more volatile aluminum-halide byproducts (e.g., chloride, bromide, or iodide). The volatile byproducts can produce severe metal contamination on substrates (e.g., silicon wafers) and lead to chamber degradation. Therefore, unless properly removed, the tin oxide could produce a completely non-manufacturable solution. Out of the above-listed halide chemistries, chlorine chemistry would be the most favorable for etching tin oxide, because of the high vapor pressure of a resulting tin tetrachloride ($SnCl_4$). However, using chlorine etchants requires changing materials used to produce the process chambers from aluminum to, for example, expensive ceramic parts or including yttrium coatings within the process chambers.

Chlorine chemistries, especially when operating in CCP chambers, reactive-ion etch (RIE) plasma-based chamber, or other types of plasma-based chambers known in the art, leads to formation of chloride ions. Chloride ions erode aluminum components by formation of volatile aluminum-chloride salts.

The information described in this section is provided to offer the skilled artisan a context for the following disclosed subject matter and should not be considered as admitted prior art.

BRIEF DESCRIPTION OF THE FIGURES

FIGS. 2A through 2F show of tables and related graphs from various design-of-experiment (DOE) analyses used to determine etch rates and etch selectivity for various embodiments of the disclosed subject matter;

FIG. 3 shows possible chemical reactions of chemicals used in some of the DOE analyses o FIGS. 2A through 2F;

FIG. 8B shows possible chemical reactions of the $SOCl_2$ chemicals used in etching $SnO_2$.

DETAILED DESCRIPTION

The disclosed subject matter will now be described in detail with reference to a few general and specific embodiments as illustrated in various ones of the accompanying drawings. In the following description, numerous specific details are set forth in order to provide a thorough understanding of the disclosed subject matter. It will be apparent, however, to one skilled in the art, that the disclosed subject matter may be practiced without some or all of these specific details. In other instances, well-known process steps or structures have not been described in detail so as not to obscure the disclosed subject matter.

Figure 1:
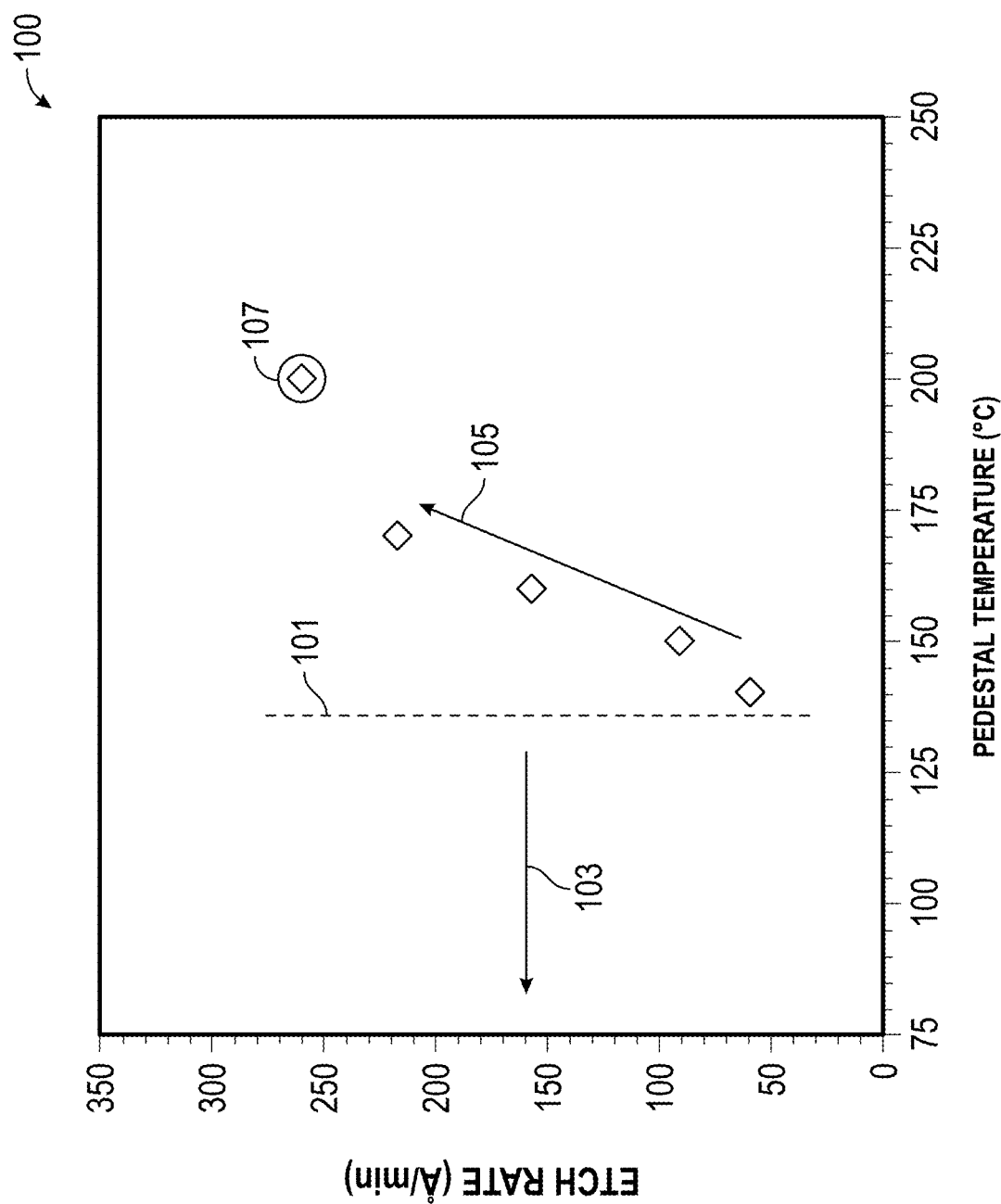
FIG. 1 is a graph exemplifying a motivation for chemical-etch testing.

FIG. 1 is a graph 100 exemplifying a motivation for chemical-etch testing. For example, in contemporaneous cleaning methods, capacitively-coupled plasma (CCP) chambers are often cleaned with a combination of methane and hydrogen. As indicated by the graph 100, at low pedestal temperatures (e.g., less than approximately 135° C. as indicated by a direction 103 from a line 101 extending vertically from 135° C.), the cleaning process is dominated by carbon deposition or tin (Sn) powder. The carbon deposition is due to the methane ($CH_4$) breaking down readily. The tin formation is due to a low $CH_4$ plasma-gas concentration. Consequently, overall etch rates for tin oxide films is low.

With continued reference to FIG. 1, however, at higher temperatures (e.g., greater than approximately 135° C.), as indicated by an increased etch-rate versus increased pedestal temperature, trendline 105, a sustained $CH_4$ concentration can be maintained. (One outlier 107 from the trendline 105 indicates a point that may not be optimized for $CH_4$ processes.) An increased or maximum-achievable etch rate is then limited by an upper temperature of the process tool. Due to, for example, deposition temperatures of approximately 65° C. and etch temperatures of approximately 170° C. (or greater) in a typical process tool, a $CH_4$ plus $H_2$ cleaning process results in significant thermal cycling. Consequently, there may be eventual problems due to thermal cycling between a wide-temperature range between deposition and cleaning temperatures.

To prevent erosion of aluminum, anodized coatings on aluminum are typically used. However, anodized coatings also have limitations, as discussed in more detail with reference to FIG. 7 below, which indicates substantial anodization cracking, suggesting that anodization may not be an effective barrier to a $Cl_2$-based CCP etch. The anodization cracking may be due to the quality and nature of anodized coatings that are available for fabrication. For example, all or nearly all anodized coatings are prone to some types of pores and/or cracks. Chlorine species can penetrate through those pores and cracks and have a negative impact on underlying aluminum features, parts, or components. Issues pertaining to use of chlorine as an etch gas have therefore warranted the use of expensive ceramic components, including chlorine-resistant alloys such as, for example, nickel-chromium-based alloys (e.g., Inconel®, available from, for example, Huntington Allows Corporation, 3200 Riverside Drive, Huntington, W. Va., USA 25720) and nickel-molybdenum-chromium-based alloys (e.g., Hastelloy®, available from, for example, Haynes Stellite Company, P.O. Box 9013, 1020 West Park Avenue, Kokomo, Ind., USA 46904), as well as expensive ceramic coatings such as yttrium oxide-based ($Y_2O_3$, or simply yttria) coatings, which still has possible physical limitations. Further, yttria-based coatings result in a large price increase for the manufacturing cost of the tool.

As noted above, contemporary technologies typically employ chlorine and chlorine-based chemistries to etch various metal oxides. In situations where chlorine does not react well with metal-oxide films, $BCl_3$ is added to a gas mixture to etch the metal-oxide films. The use of such chemistries always or nearly always results in challenges associated with corrosion of anodized aluminum and aluminum components. For example, $BCl_3$ may etch metal-oxide films better than $Cl_2$. However, $BCl_3$ also reacts with aluminum more violently than $Cl_2$. Consequently, process chambers which deploy $Cl_2$ or $BCl_3$, as etch or clean gases, always or nearly always use ceramic components or expensive coatings (e.g., yttria) as noted above.

Consequently, there is a need for a chemistry that can etch tin oxide and other metal-oxide films, while continuing to use materials, such anodized aluminum and aluminum, in order to produce processing tools with a significantly lower cost as compared with using ceramic components and other expensive coatings.

In the disclosed subject matter, $SOCl_2$ was considered as a chemistry to remove tin oxide while not etching aluminum and aluminum alloys. As discussed in greater detail below, $SOCl_2$ has a lower corrosive impact on anodized aluminum and aluminum as compared with a chlorine-based chemistry.

Figure 2B:
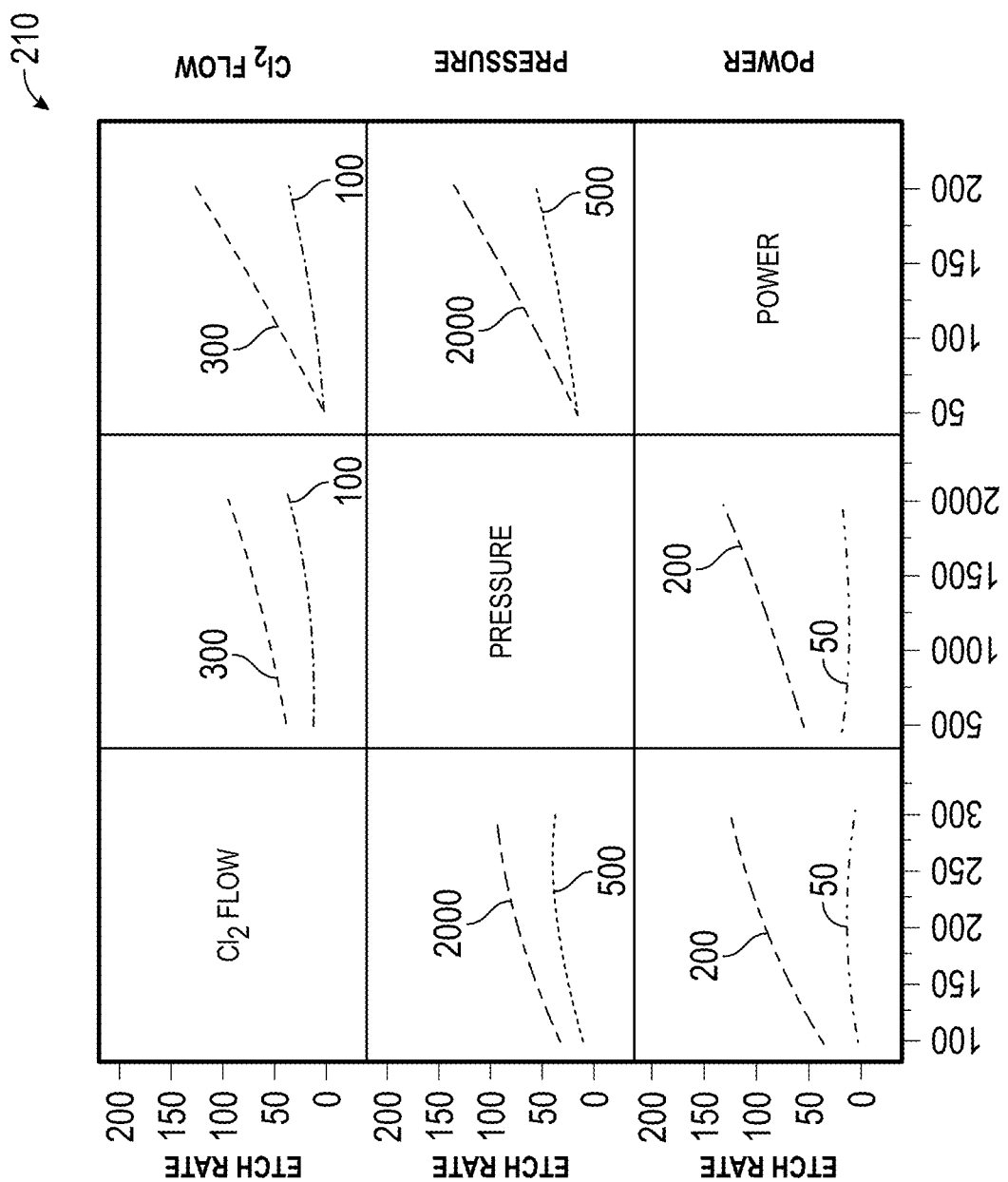

Referring now to FIGS. 2A and 2B, chlorine etch rates were considered for various process conditions as shown in the table 200 of FIG. 2A and accompanying graph 210 of FIG. 2B in a particular type of CCP process chamber. The graph 210 of FIG. 2B indicates etch rates as function of $Cl_2$ volumetric flow rate [sccm], pressure [mTorr], and power [W]. The etch rate [Å/min] refers to the etch rate of tin oxide. As shown in the table 200, etch rates of approximately 180 Å/min were achieved for run 16 at the process conditions shown.

Figure 2D:
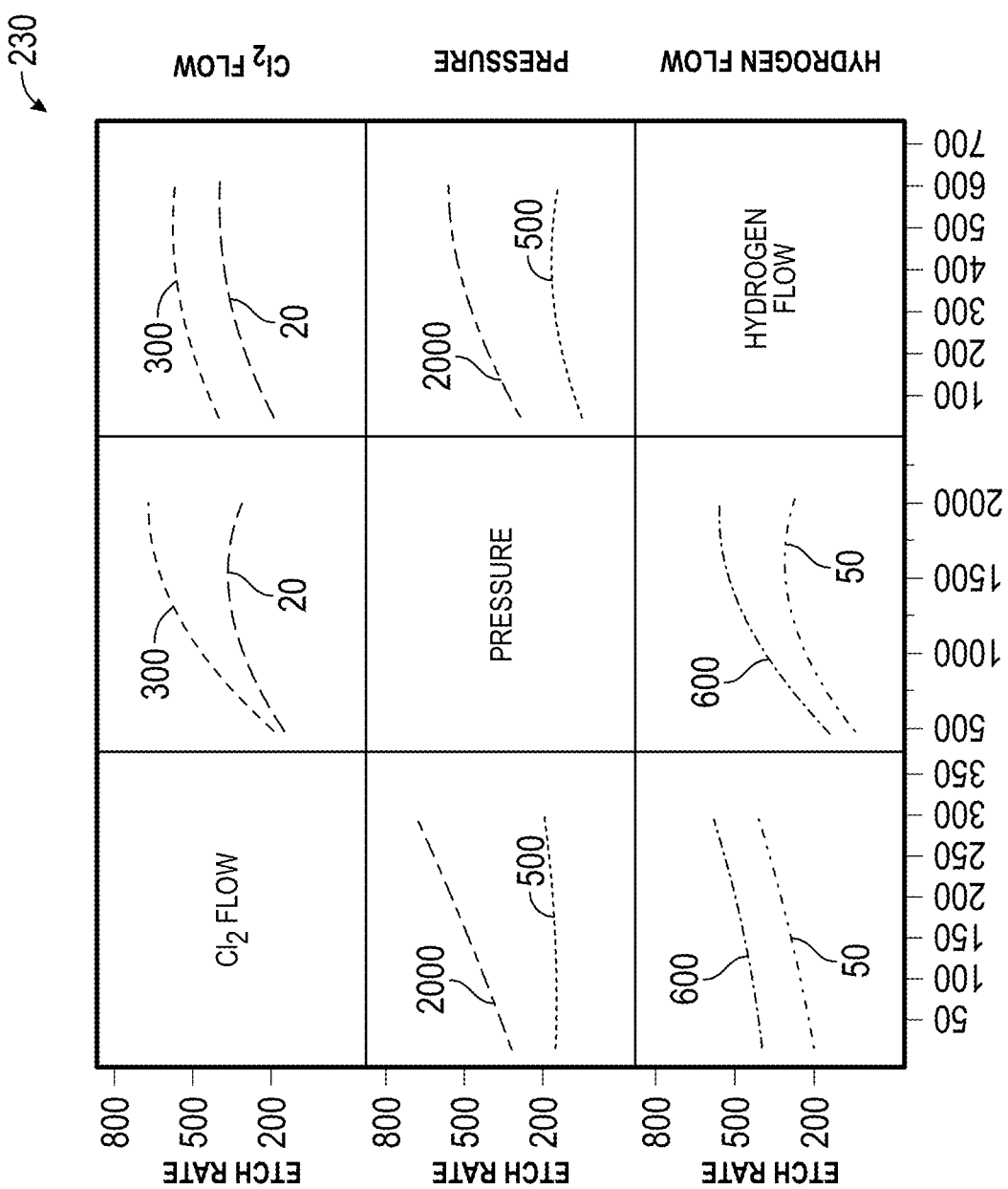

In FIGS. 2C and 2D, chlorine was coupled with hydrogen for etch testing as shown in the table 220 of FIG. 2B and accompanying graph 230 of FIG. 2D. The etch rates were considered for various process conditions as shown in the table 220 and the accompanying graph 230 in the CCP process chamber. As shown in the table 220, etch rates of approximately 730 Å/min were achieved for run 16 at the process conditions shown. Also, the combination of chlorine and hydrogen also had a higher selectivity to ALD oxide while most conditions showed no powder (as discussed above with reference to FIG. 1).

Figure 2F:
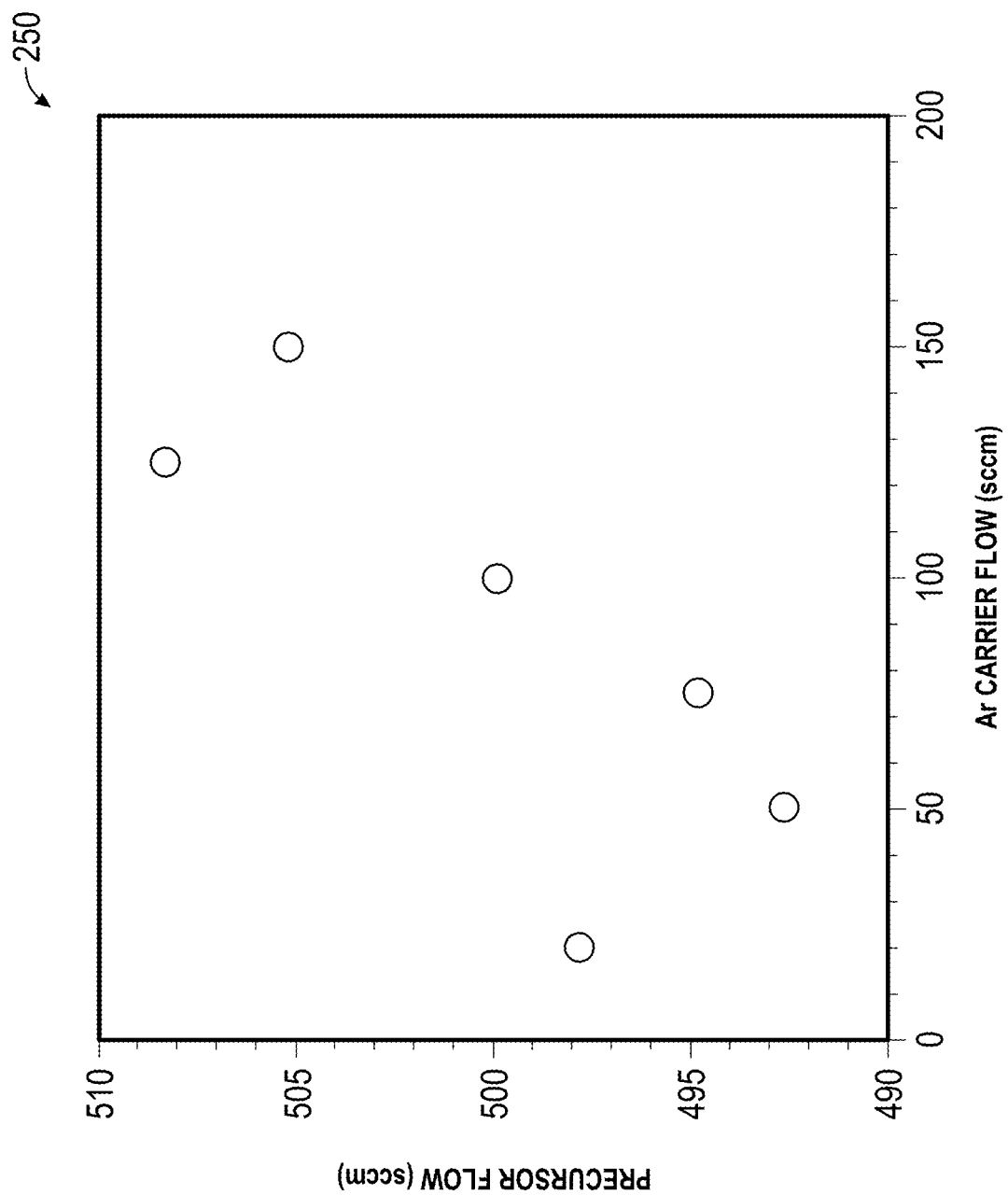

In FIGS. 2E and 2F, $SOCl_2$ was used for etch testing. The etch rates were considered for various process conditions as shown in table 240 of FIG. 2E and precursor and argon (Ar) carrier flow rates in the CCP process chamber are shown in an accompanying graph 250 in FIG. 2F, which shows precursor flow [sccm] as a function of Ar carrier flow [sccm]. As shown in the table 240, etch rates exceeding approximately 3000 Å/min were achieved for several test-runs with various process condition. Also, the combination of $SOCl_2$ and argon also had a higher selectivity to ALD oxide. Therefore, a summary of FIGS. 2A through 2F indicates etch rates as follows:

$Cl_2$ (approximately 180 Å/min)
$Cl_2+H_2$ (approximately 730 Å/min)
$SOCl_2$ (over 3000 Å/min).

Possible reactions using the $SOCl_2$ combined with tin oxide or silicon dioxide are shown in FIG. 3. As indicated, a reaction using two thionyl chloride ($SOCl_2$) molecules to etch tin oxide ($SnO_2$) produces tin tetrachloride ($SnCl_4$) plus two sulfur dioxide ($SO_2$) molecules. A reaction using two thionyl chloride ($SOCl_2$) molecules to etch silicon dioxide ($SiO_2$) produces silicon tetrachloride ($SiCl_4$) plus two sulfur dioxide ($SO_2$) molecules. Consequently, the results indicate that metal-oxide films, for example, $SnO_2$ films, can be etched at significantly higher etch-rates compared to chlorine with this $SOCl_2$ chemistry. Apart from the higher etch-rates, the skilled artisan will also recognize that this chemistry with CCP chambers shows little or no damage on anodized aluminum and very minor damage on aluminum, whereas the chlorine chemistry showed significantly higher damage as shown and described in detail below.

Figure 4A:
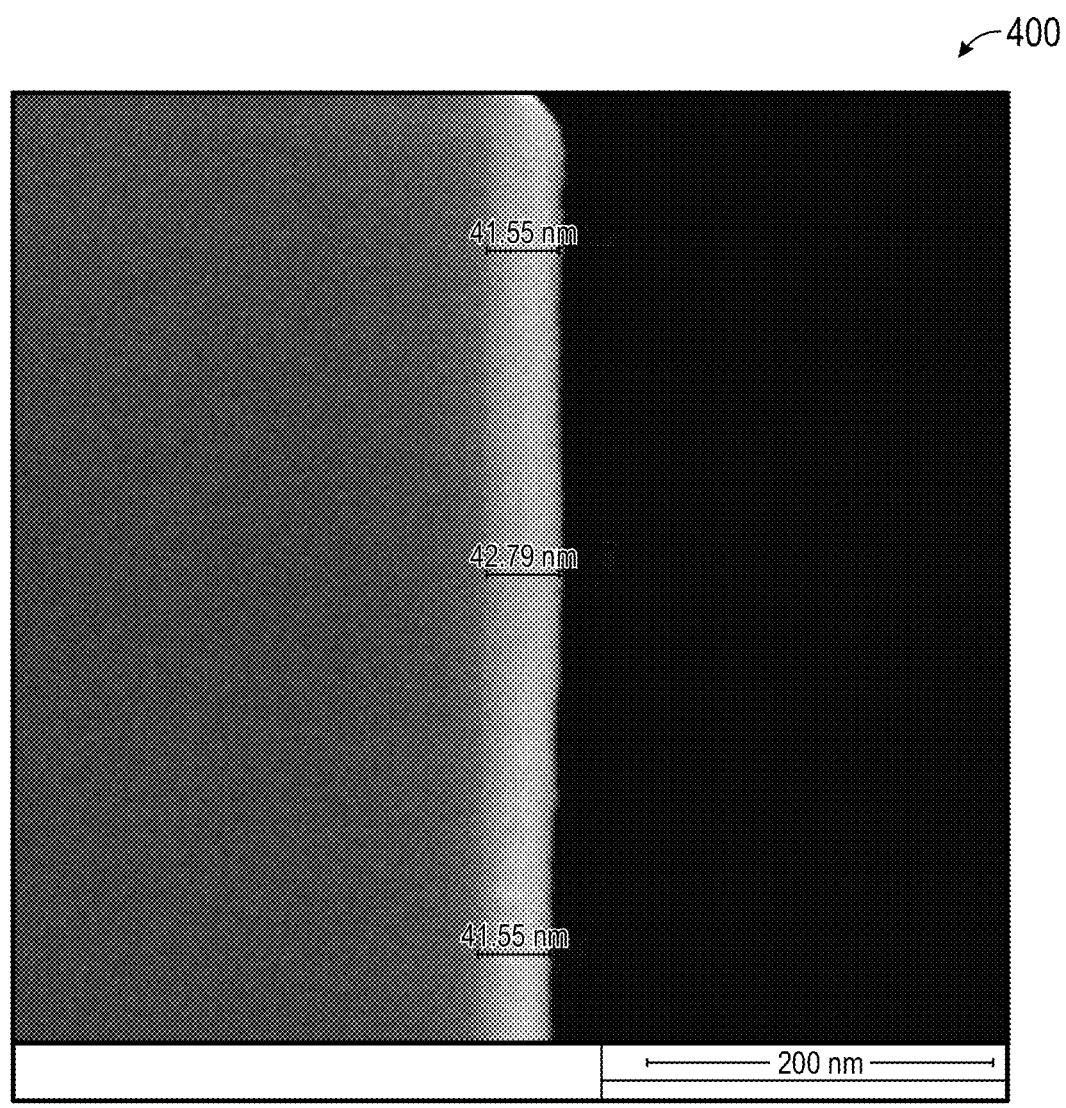
FIGS. 4A and 4B show cross-sectional, scanning-electron microscopy images of remaining film thicknesses in accordance with embodiments of the disclosed subject matter.
Figure 4B:
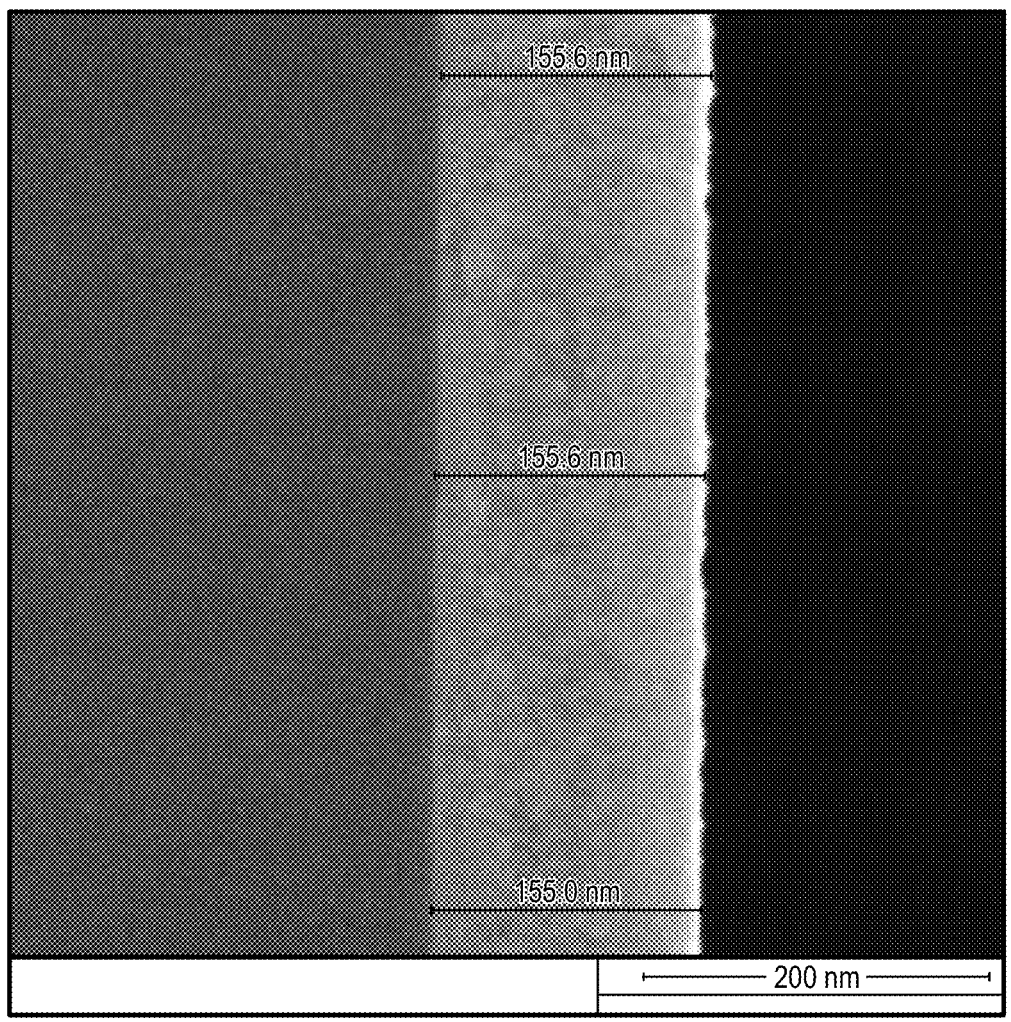

For example, FIGS. 4A and 4B show cross-sectional, scanning-electron microscopy (X-SEM) images 400, 410 of remaining film thicknesses. In the X-SEM image 400 of FIG. 4A and the X-SEM image 410 of FIG. 4B, measurements of remaining film thicknesses by X-SEM (e.g., as indicated at approximately 41.6 nm to about 42.8 nm, and at about 155.0 nm to about 155.6 nm, respectively) are in good agreement with measurements performed using ellipsometry (e.g., indicating thicknesses of approximately 45 nm and approximately 148 nm for FIGS. 4A and 4B, respectively).

Figure 5A:
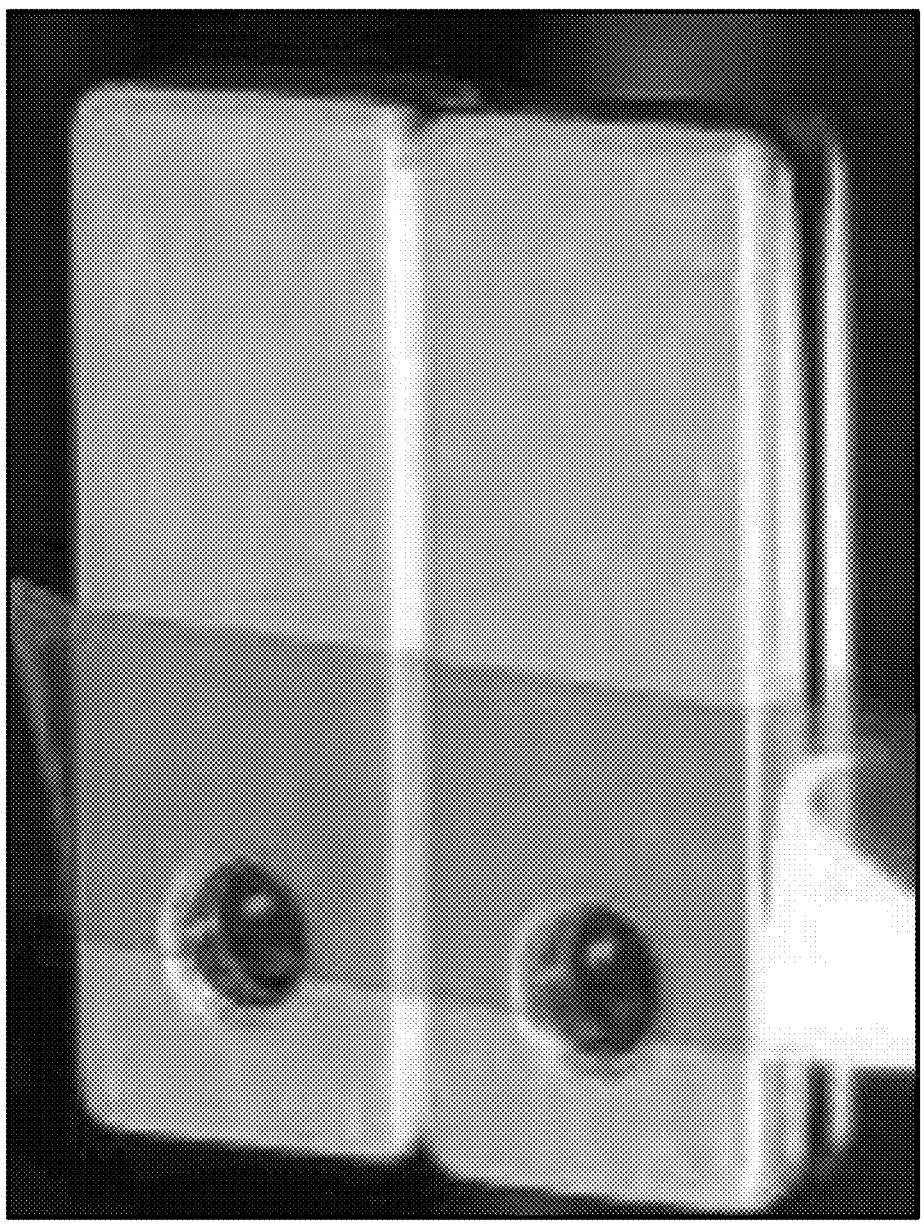
FIGS. 5A through 5D show coupons from aluminum (Al) material compatibility studies.

FIGS. 5A-5D show coupons comprised of aluminum (Al) material for chemistry compatibility-studies. FIG. 5A shows incoming coupons 500 of Al material used to test etching of $Cl_2$ versus $SOCl_2$ prior to any etching being performed. Both aluminum 6061 and 3003 alloys were considered as these aluminum alloys are commonly used in construction of process chambers as well as other process tools in the semiconductor industry.

Figure 5B:
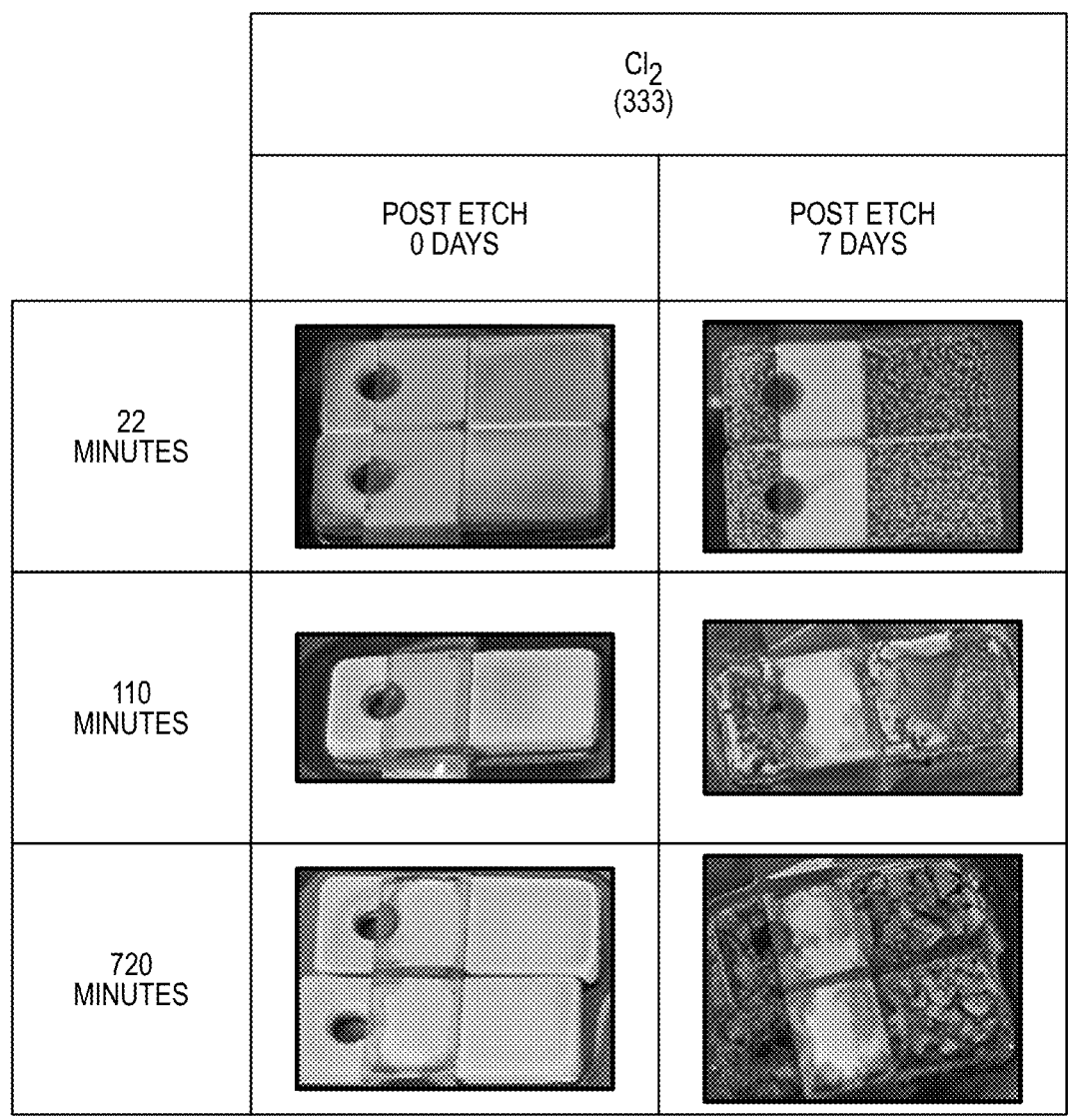

FIG. 5B shows the results 510 of a post etch test using $Cl_2$ on the aluminum coupons after 0 days and 7 days when each of the aluminum coupons were etched for 22 minutes, 110 minutes, and 720 minutes, respectively, in $Cl_2$. The etching in $Cl_2$ clearly indicates extreme corrosion of the aluminum coupons etched in $Cl_2$.

Figure 5C:
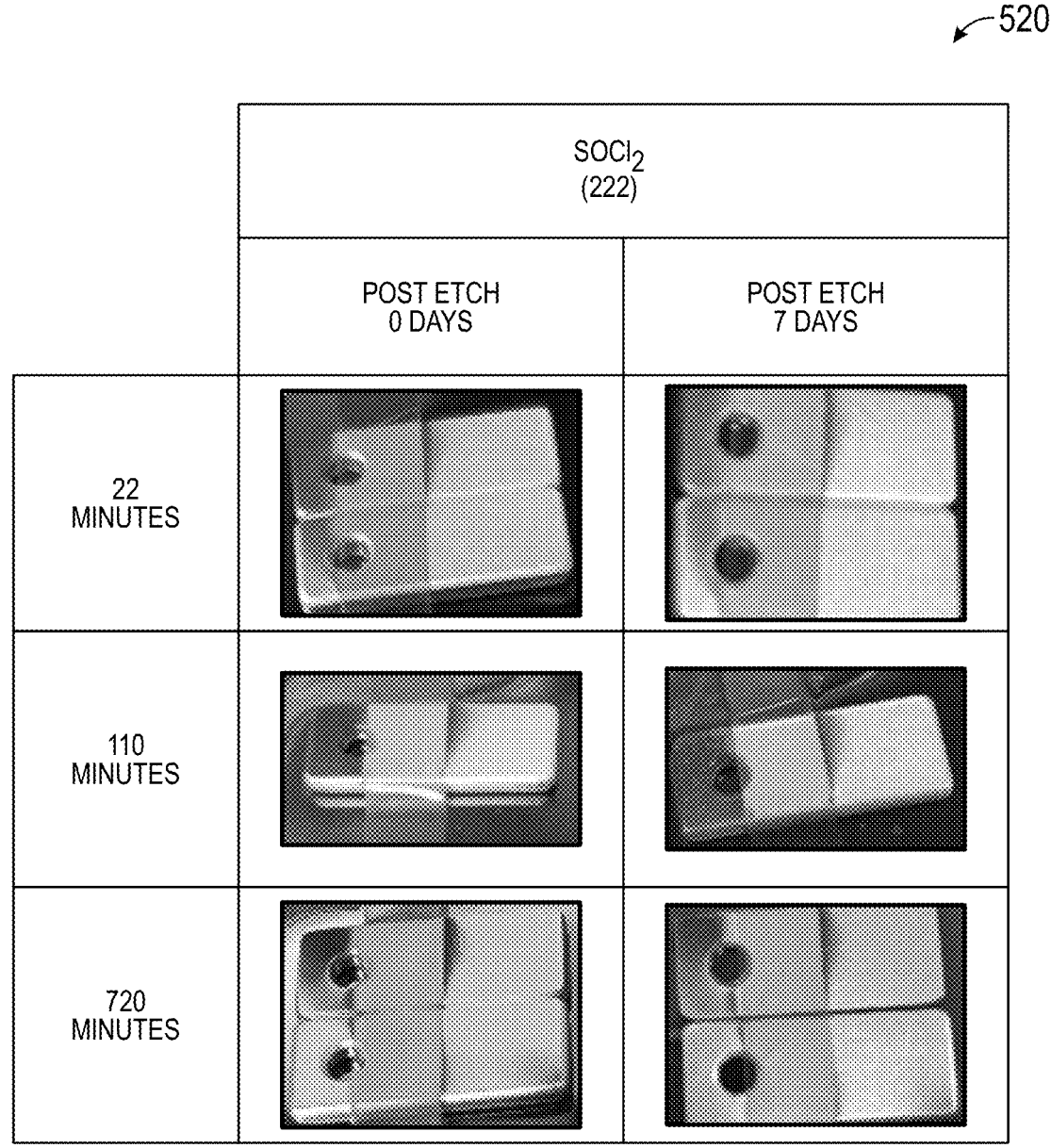

FIG. 5C shows the results 520 of a post etch test using $SOCl_2$ on the aluminum coupons after 0 days and 7 days when each of the aluminum coupons were etched for 22 minutes, 110 minutes, and 720 minutes, respectively, in $SOCl_2$. The etching in $SOCl_2$ indicates little to no corrosion of the aluminum coupons etched in $SOCl_2$ with only minor discoloration for the aluminum samples etched in $SOCl_2$ for 720 minutes.

Figure 5D:
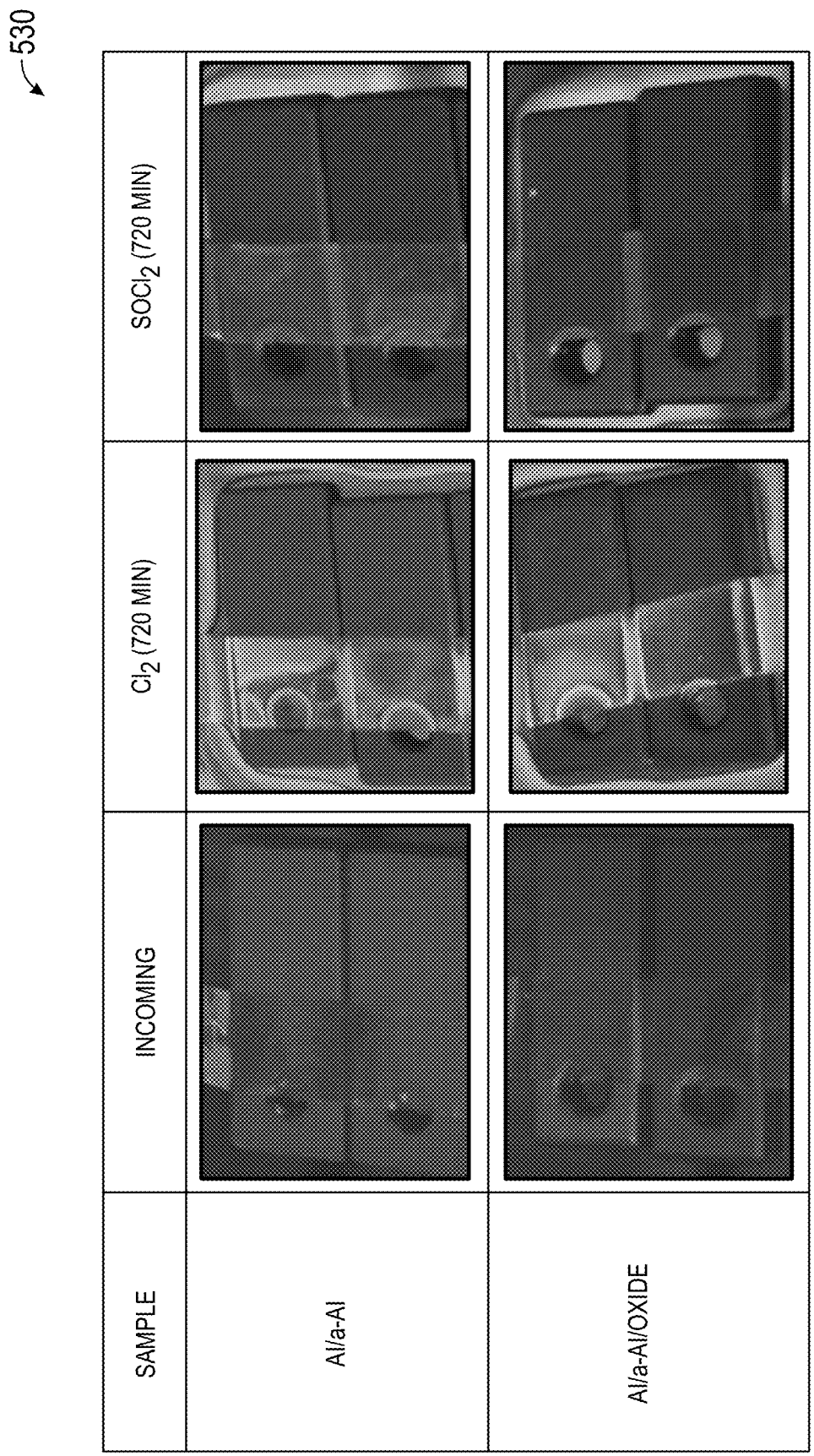

FIG. 5D shows incoming test pieces 530 of anodized aluminum samples including Al/a-Al and Al/a-Al/Oxide compared with etching in $Cl_2$ and $SOCl_2$ for 720 minutes each. The samples etched in $Cl_2$ each show a more significant color change than the samples etched in $SOCl_2$.

Figure 6:
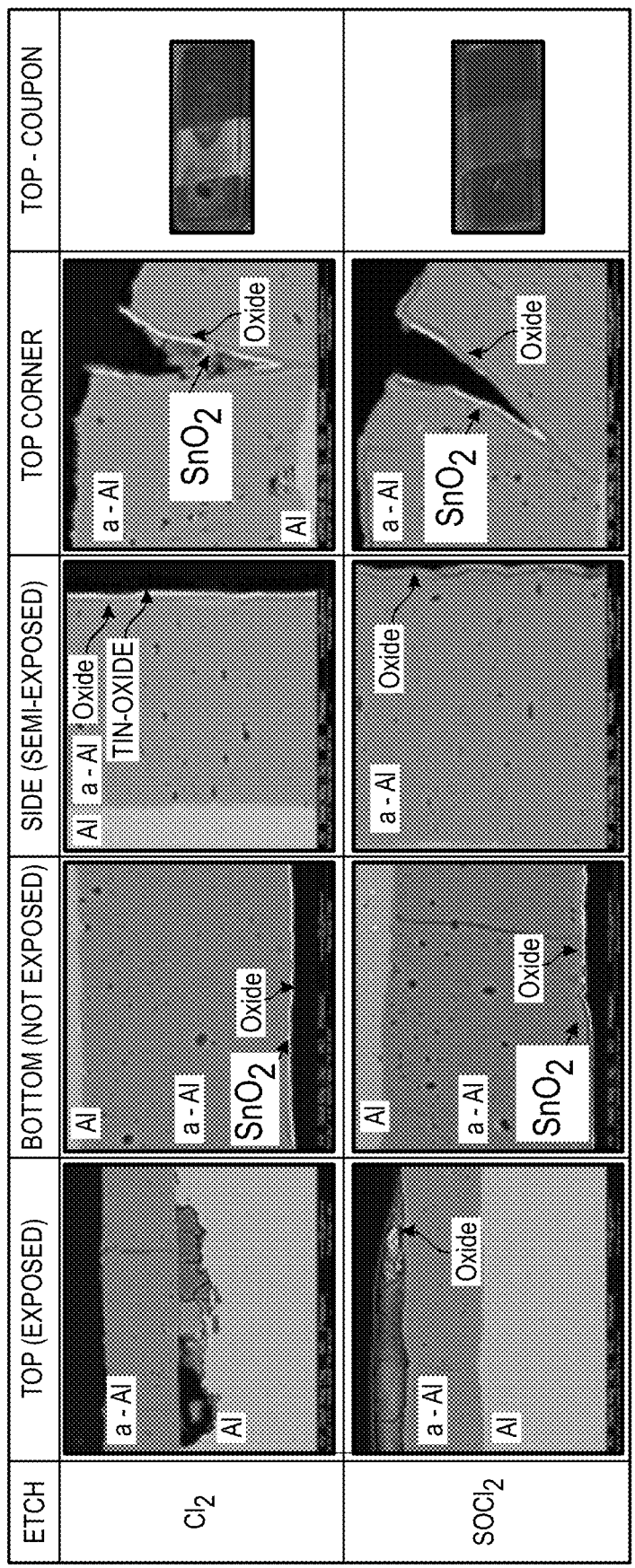
FIG. 6 shows cross-sectional, scanning-electron microscopy images of effects of etch on anodized aluminum.

Referring now to FIG. 6, cross-sectional, scanning-electron microscopy images of effects of etch on anodized aluminum are shown. The samples were each etched in either $Cl_2$ or $SOCl_2$ for 720-minute exposures. The exposures to $Cl_2$ (in the top row) clearly indicate extreme corrosion of aluminum under the anodization. However, very little to no corrosion was observed with the anodized aluminum samples, in the bottom row, exposed to $SOCl_2$.

Figure 7:
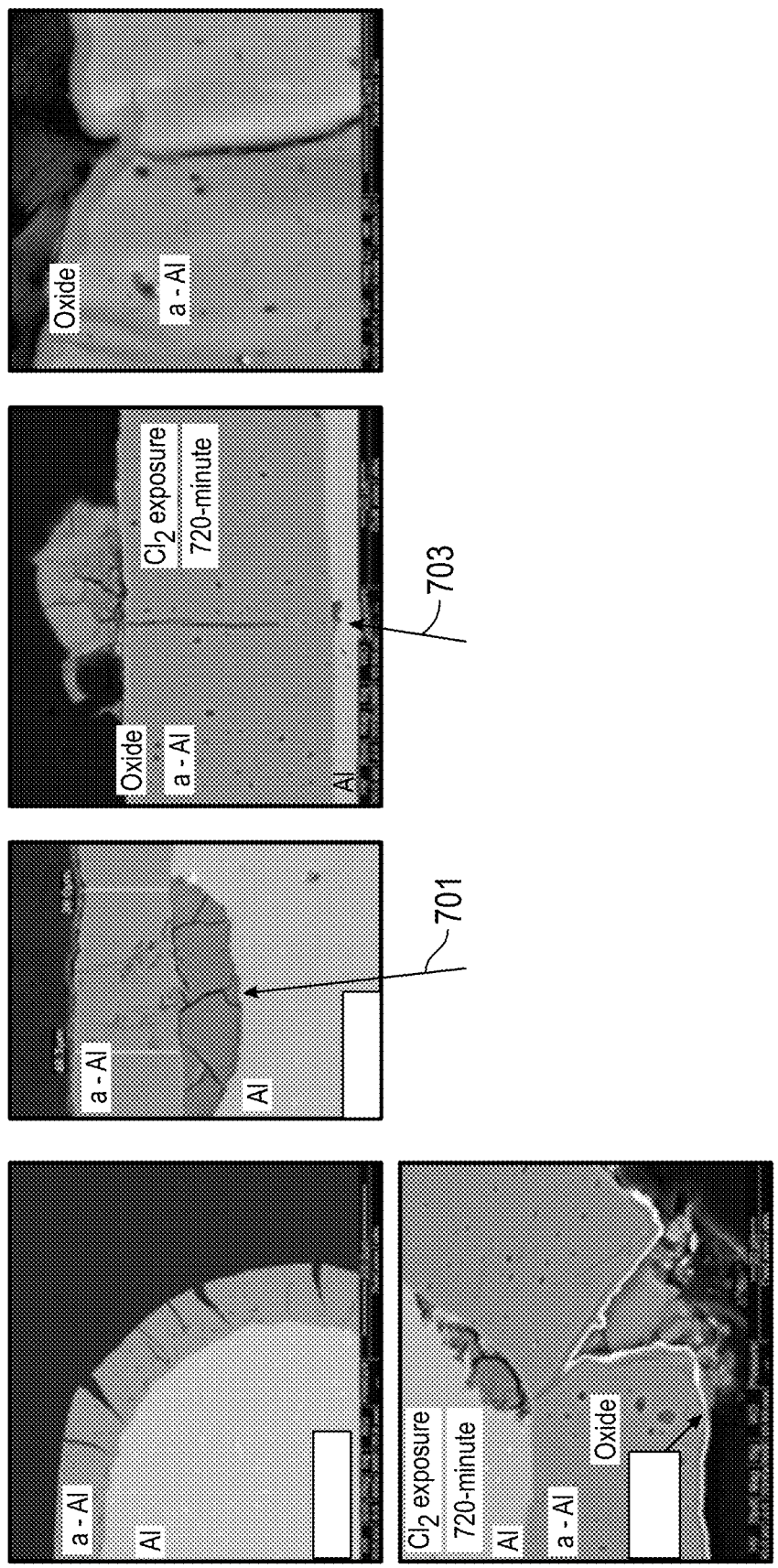
FIG. 7 shows cross-sectional, scanning-electron microscopy images of anodization cracks on aluminum.

FIG. 7 shows cross-sectional, scanning-electron microscopy images of anodization cracks on aluminum. FIG. 7 indicates that anodization fails to be an effective barrier to $Cl_2$. FIG. 7 also indicates that cracks 701, 703 can allow corrosive gases to penetrate through an anodization layer and attack underlying aluminum Corners and other abruptly changing feature morphologies especially tend to incur a large amount of anodization cracking. Therefore, anodization techniques do not provide an effective barrier to $Cl_2$ in, for example, a Cl2 CCP etch process.

Figure 8A:
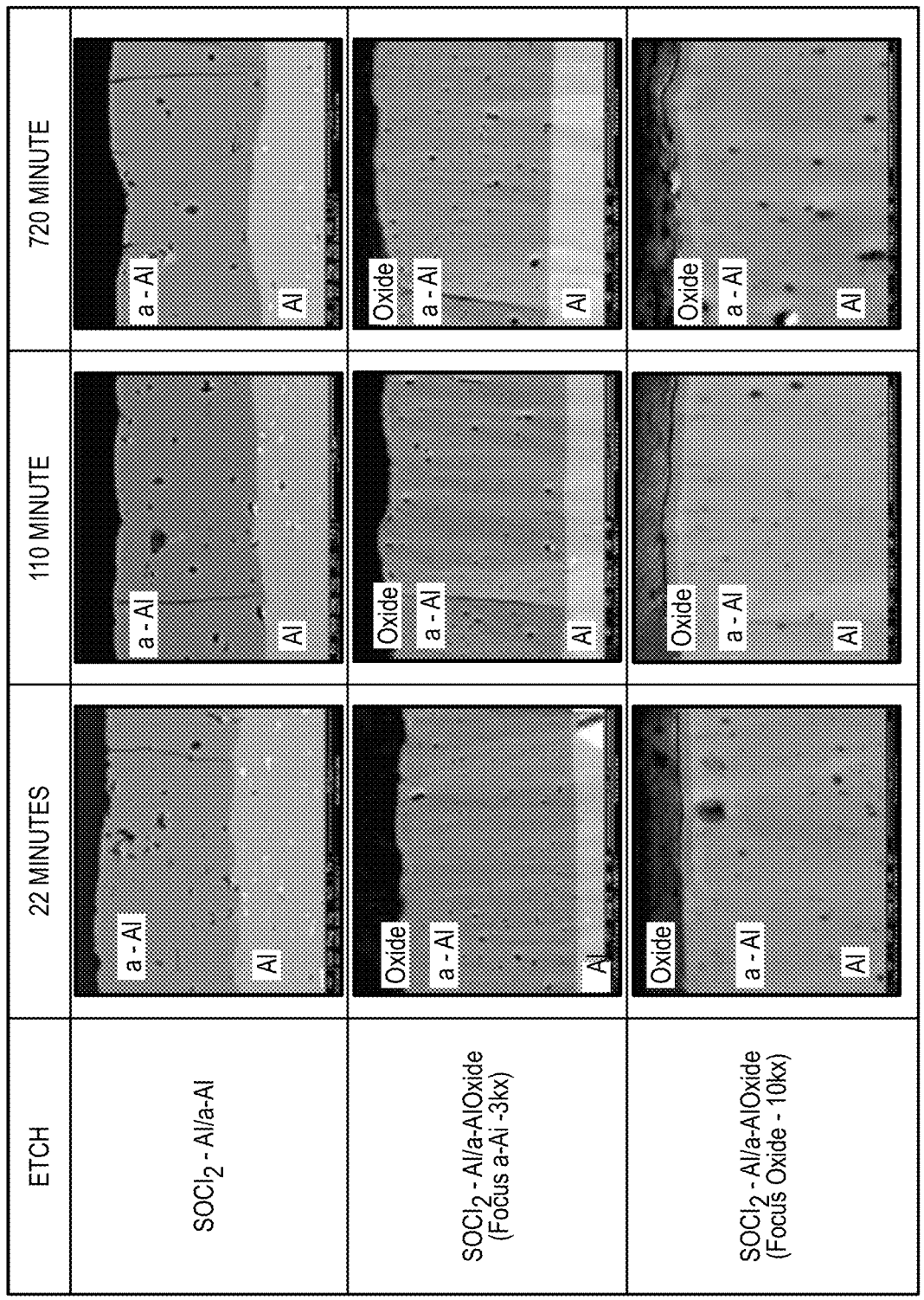
FIG. 8A shows cross-sectional, scanning-electron microscopy images of limited to no effects of thionyl chloride ($SOCl_2$), in accordance with various embodiments disclosed herein, with various materials overlaying aluminum.

FIG. 8A shows cross-sectional, scanning-electron microscopy images showing limited to no effects of thionyl chloride ($SOCl_2$), in accordance with various embodiments disclosed herein, with various materials overlaying aluminum. The $SOCl_2$ exhibited little to no attack of the aluminum under the anodized aluminum, even with a 720-minute exposure to $SOCl_2$. The ALD oxide shows a low etch rate, in accordance with the DOE analysis presented above.

FIG. 8B shows possible chemical reactions of the $SOCl_2$ chemicals used in etching $SnO_2$. Therefore, the $SOCl_2$ seems to be reacting as a surface reaction and not dissociating before the surface reaction since, as noted above, there is no observed attack of the aluminum by the $SOCl_2$.

Figure 8C:
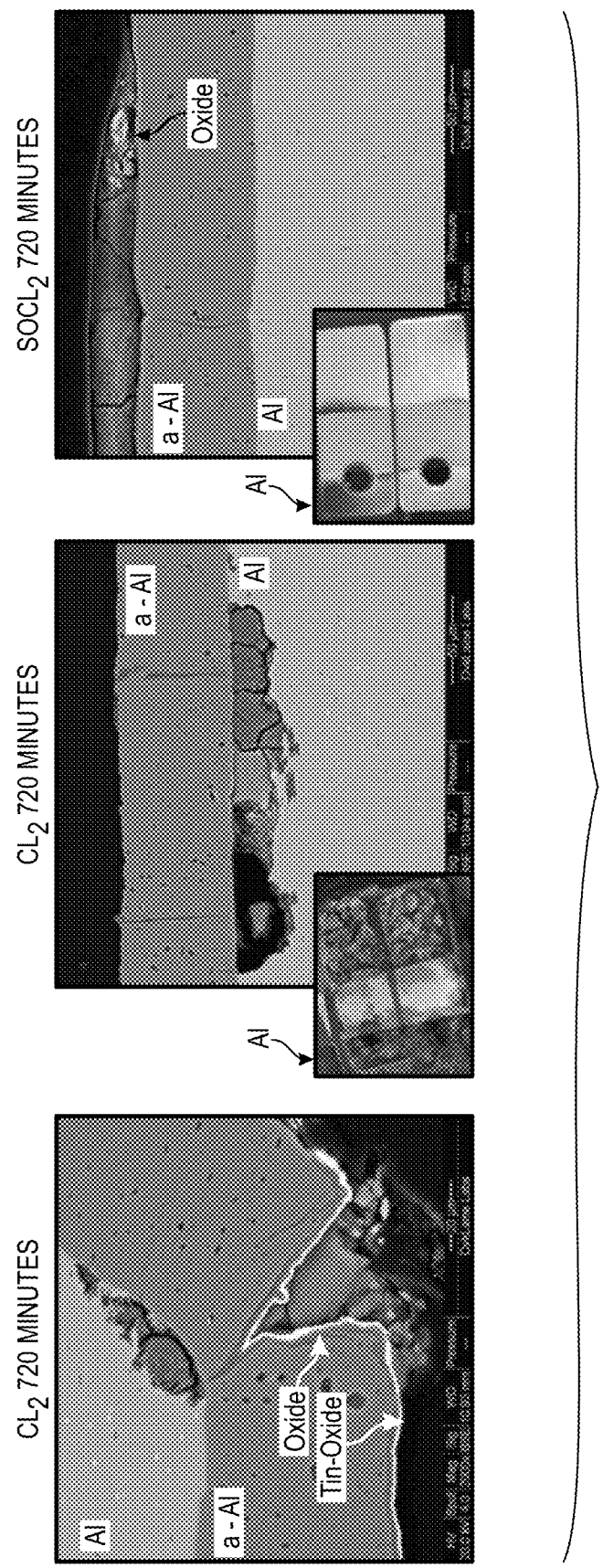
FIG. 8C provides a graphical summary of conclusions in accordance with various embodiments of the disclosed subject matter.

FIG. 8C provides a graphical summary of conclusions. As noted above, the etch rates from the DOE analysis indicated CCP chamber etch rates as follows:

$Cl_2$ (approximately 180 Å/min)
$Cl_2+H_2$ (approximately 730 Å/min)
$SOCl_2$ (over 3000 Å/min).

The $Cl_2$ had an increasing selectivity with an increasing etch rate. The material compatibility analysis indicated that $Cl_2$ exhibited a strong attack of aluminum even through anodization and oxide with an exposure to $Cl_2$ of 720 minutes. In contrast, the $SOCl_2$ showed little to no attack of aluminum through anodization even at a 720-minute exposure.

One hypothesis for the higher etch rate observed with $SOCl_2$ is its ability to getter oxygen out of the metal-oxide film to form $SO_2$ (a volatile byproduct) along with the formation of the volatile chemical tin tetrachloride ($SnCl_4$). In the case of using chlorine chemistry, the oxygen in the metal-oxide film leads to formation of $SnOCl_2$ or $SnOCl_4$ which is not as volatile as $SnCl_4$ and thus leads to a slowdown in reaction rates.

A hypothesis for the $SOCl_2$ chemistry showing less attack on aluminum and anodized aluminum is the possibility of oxygen species acting as a self-passivation species, leading to formation of aluminum oxide instead of aluminum chloride when both oxygen species and chlorine species are present. There is also a possibility that the breakdown of $SOCl_2$ in a plasma state is such that S=O bonds absorbs a lot of the energy, leading to formation of chloride ions with lower energy, which are not that harmful on the anodized components.

Although the results were conducted in CCP chambers, the skilled artisan will recognize that similar results should be expected in RIE plasma, high-density plasma (HDP)-based devices and tools, inductively-coupled plasma (ICP)-based devices and tools, and others, as a way to etch metal-oxide films and also a way to use chlorine-based chemistry with anodized aluminum and aluminum parts.

Therefore, the use of $SOCl_2$ as a way to supply chloride ions/species to clean/etch metal oxides in, for example, CCP or RIE chambers in such a way that it etches the metal oxide at significantly higher etch rates compared with chlorine itself. Also, the ability of the $SOCl_2$ to provide these high etch-rates while not attacking the anodized aluminum and minimal attack on aluminum components is unique and provides an opportunity to use this chemistry to etch metal-oxide films with anodized parts, without the need of going to ceramic parts or yttrria-coated parts which are extremely expensive.

Use of the chemistry $SOCl_2$ provides unique advantages in terms of etching metal-oxide films with chlorine ions while not attacking the anodization and aluminum components of the chambers in which such films are formed. Not attacking aluminum components is in stark contrast with chlorine or $BCl_3$ chemistries that are typically used by the semiconductor and related industries.

As noted herein, when comparing etch rates of $SnO_2$ films in chlorine and $SOCl_2$ in CCP chambers, an etch rate of $SnO_2$ of up to 10-times higher in $SOCl_2$ chemistry compared to $Cl_2$ chemistry for similar volumetric flow-rates and process conditions. The high etch-rate observed for $SnO_2$ in $SOCl_2$ stems from the fact that the $SOCl_2$ is able to getter the oxygen species from the $SnO_2$ films, thereby forming volatile $SO_2$ and volatile $SnCl_4$.

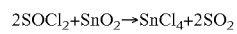

$$2SOCl_2+SnO_2 \rightarrow SnCl_4+2SO_2$$

An additional factor to consider is that, for a given application, the boiling point of $SnCl_4$ is 114° C.

In the case of $Cl_2$, the reaction produces less volatile $SnOCl_4$.

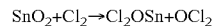

$$SnO_2+Cl_2 \rightarrow Cl_2OSn+OCl_2$$

with decomposition ½ $Cl_2$.

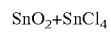

$$SnO_2+SnCl_4$$

Decomposition of $Cl_2OSn$ reaction would happen with additional chlorine and would lead to formation of:

SnCl$_4$ and SnO$_2$ → SnO$_2$ + SnCl$_4$

The reaction of Cl$_2$ is unfavorable due to the formation of less-volatile SnOCl$_2$ while the reaction with SOCl$_2$ is more favorable and, consequently, etch rates are higher with SOCl$_2$.

In addition to higher etch rates seen with SOCl$_2$ chemistry compared to Cl$_2$ chemistry with SnO$_2$ film, the SOCl$_2$ chemistry doesn't attack anodized aluminum and very minimally attacks aluminum. As disclosed herein, this behavior is very different than what was observed with Cl$_2$ chemistry where aluminum components were corroded heavily and even completely destroyed. Even anodized aluminum showed signs of erosion in the aluminum layer below the anodized layer (anodization also suffered a loss in thickness).

The ability to use this SOCl$_2$ chemistry provides a pathway to etch and clean metal-oxide films such as SnO$_2$ from process chambers while still using anodization components, while not resorting to ceramic components or yttria-based coatings which are typically extremely expensive and can make the entire tool cost highly prohibitive.

EXAMPLES OF THE DISCLOSED SUBJECT MATTER

In a first example, the disclosed subject matter includes a method of etching tin oxide (SnO$_2$) films from surfaces. The method includes using thionyl chloride (SOCl$_2$) chemistry to etch at least a portion of the SnO$_2$ films, and gettering oxygen species from the SnO$_2$ films by using the SOCl$_2$ chemistry, thereby forming volatile SO$_2$ and volatile SnCl$_4$.

A second example includes the method of the first example, where the surfaces comprise at least one material including materials of aluminum and anodized aluminum.

A third example includes any one of the preceding examples, and where the SOCl$_2$ chemistry used to etch at least a portion of the SnO$_2$ films produces an etch rate of the SnO$_2$ films of up to ten-times higher as compared with chlorine Cl$_2$ chemistry for comparable flow-rates and process conditions.

A fourth example includes any one of the preceding examples, and further includes avoiding using one or more of the following chemistries to avoid forming one or more volatile aluminum-halide byproducts, the chemistries including chlorine (Cl$_2$), hydrochloric acid (HCl), bromide (Br), hydrobromic acid (HBr), boron trichloride (BCl$_3$), hydrogen iodide (HI), and iodine (I$_2$).

A fifth example includes any one of the preceding examples, where the surfaces include interior portions of plasma-based processing chambers.

A sixth example includes any one of the preceding examples, where the SOCl$_2$ chemistry does not etch anodized aluminum.

In a seventh example, the disclosed subject matter includes a method of cleaning tin oxide from interior portions of a plasma-based processing chamber. The method includes introducing methane into the processing chamber, maintaining a temperature of greater than about 135° C. within the processing chamber to maintain a concentration level of the methane, and introducing thionyl chloride into the processing chamber and avoiding introducing chlorine into the processing chamber.

An eighth example includes the method of the seventh example, where the interior portions of the plasma-based processing chamber comprise at least one material including materials of aluminum and anodized aluminum.

A ninth example includes the method of the eighth example, and further includes avoiding introducing one or more of the following chemistries into the processing chamber to avoid forming one or more volatile aluminum-halide byproducts, the chemistries including hydrochloric acid (HCl), bromide (Br), hydrobromic acid (HBr), boron trichloride (BCl$_3$), hydrogen iodide (HI), and iodine (I$_2$).

In a tenth example, the disclosed subject matter includes a method for removing metal-oxide films from aluminum and aluminum-based surfaces of plasma-based processing chambers. The method includes introducing methane (CH$_4$) into the processing chamber, introducing hydrogen (H$_2$) into the processing chamber, maintaining a temperature of greater than about 135° C. within the processing chamber to maintain a concentration level of the methane, and introducing thionyl chloride (SOCl$_2$) into the processing chamber and avoiding introducing chlorine (Cl$_2$) into the processing chamber.

An eleventh example includes the method of the tenth example, and further includes avoiding introducing one or more of the following chemistries into the processing chamber to avoid forming one or more volatile aluminum-halide byproducts, the chemistries including hydrochloric acid (HCl), bromide (Br), hydrobromic acid (HBr), boron trichloride (BCl$_3$), hydrogen iodide (HI), and iodine (I$_2$).

A twelfth example includes any one of the preceding examples, where the metal-oxide film is tin oxide (SnO$_2$).

A thirteenth example includes the method of the twelfth example, where a reaction using two thionyl chloride (SOCl$_2$) molecules to etch the tin oxide (SnO$_2$) produces tin tetrachloride (SnCl$_4$) plus two sulfur dioxide (SO$_2$) molecules.

A fourteenth example includes any one of the preceding examples, and further includes etching dielectric materials from the surfaces of the of plasma-based processing chambers.

A fifteenth example includes the method of the fourteenth example, where the dielectric material is silicon dioxide (SiO$_2$).

A sixteenth example includes the method of the fifteenth example, where a reaction using two thionyl chloride (SOCl$_2$) molecules to etch the silicon dioxide (SiO$_2$) produces silicon tetrachloride (SiCl$_4$) plus two sulfur dioxide (SO$_2$) molecules.

Throughout this specification, plural instances may implement components, operations, chemistries, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Certain embodiments may be described herein as including logic or a number of components, modules, mechanisms, or particular chemistries. In various embodiments, one or more computer systems (e.g., a standalone computer system, a client computer system, or a server computer system) or one or more hardware modules of a computer system (e.g., a processor or a group of processors) may be configured by software (e.g., an application or application portion) as a hardware module that operates to perform certain operations (e.g., various process recipes) as described herein.

As used herein, the term "or" may be construed in an inclusive or exclusive sense. Further, other embodiments will be understood by a person of ordinary skill in the art upon reading and understanding the disclosure provided. Further, upon reading and understanding the disclosure provided herein, the person of ordinary skill in the art will readily understand that various combinations of the chemistries, techniques, and examples provided herein may all be applied in various combinations.

Although various embodiments are discussed separately, these separate embodiments are not intended to be considered as independent techniques or designs. As indicated above, each of the various portions may be inter-related and each may be used separately or in combination with other portions and embodiments discussed herein. For example, although various embodiments of methods, operations, chemistries, and processes have been described, these methods, operations, chemistries, and processes may be used either separately or in various combinations.

Consequently, many modifications and variations can be made, as will be apparent to a person of ordinary skill in the art upon reading and understanding the disclosure provided herein. Functionally equivalent methods and devices within the scope of the disclosure, in addition to those enumerated herein, will be apparent to the skilled artisan from the foregoing descriptions. Portions and features of some embodiments may be included in, or substituted for, those of others. Such modifications and variations are intended to fall within a scope of the appended claims. Therefore, the present disclosure is to be limited only by the terms of the appended claims, along with the full scope of equivalents to which such claims are entitled. It is also to be understood that the terminology used herein is for the purpose of describing particular embodiments only and is not intended to be limiting.

The Abstract of the Disclosure is provided to allow the reader to quickly ascertain the nature of the technical disclosure. The abstract is submitted with the understanding that it will not be used to interpret or limit the claims. In addition, in the foregoing Detailed Description, it may be seen that various features may be grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

What is claimed is:

1. A method of cleaning tin oxide from interior portions of a plasma-based processing chamber, the method comprising:
introducing methane into the processing chamber;
maintaining a temperature of greater than about 135° C. within the processing chamber to maintain a concentration level of the methane; and
avoiding introducing chlorine into the processing chamber.

2. The method of claim 1, wherein the interior portions of the plasma-based processing chamber comprise at least one material including materials of aluminum and anodized aluminum.

3. The method of claim 2, further comprising avoiding introducing one or more of the following chemistries into the processing chamber to avoid forming one or more volatile aluminum-halide byproducts, the chemistries including hydrochloric acid (HCl), bromide (Br), hydrobromic acid (HBr), boron trichloride ($BCl_3$), hydrogen iodide (HI), and iodine ($I_2$).

4. A method for removing metal-oxide films from aluminum and aluminum-based surfaces of plasma-based processing chambers, the method comprising:
introducing methane ($CH_4$) into the processing chamber;
introducing hydrogen ($H_2$) into the processing chamber;
maintaining a temperature of greater than about 135° C. within the processing chamber to maintain a concentration level of the methane; and
avoiding introducing chlorine ($Cl_2$) into the processing chamber.

5. The method of claim 4, further comprising avoiding introducing one or more of the following chemistries into the processing chamber to avoid forming one or more volatile aluminum-halide byproducts, the chemistries including hydrochloric acid (HCl), bromide (Br), hydrobromic acid (HBr), boron trichloride ($BCl_3$), hydrogen iodide (HI), and iodine ($I_2$).

6. The method of claim 4, wherein the metal-oxide film is tin oxide ($SnO_2$).

7. The method of claim 4, further comprising etching dielectric materials from the surfaces of the of plasma-based processing chambers.

8. The method of claim 7, wherein the dielectric material is silicon dioxide ($SiO_2$).

* * * * *